United States Patent
Lin et al.

(10) Patent No.: US 9,542,992 B2
(45) Date of Patent: Jan. 10, 2017

(54) SRAM CORE CELL DESIGN WITH WRITE ASSIST

(71) Applicant: NVIDIA CORPORATION, Santa Clara, CA (US)

(72) Inventors: Hwong-Kwo Lin, Palo Alto, CA (US); Ge Yang, Dublin, CA (US); Fei Song, Santa Clara, CA (US); Xi Zhang, San Jose, CA (US); Haiyan Gong, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 151 days.

(21) Appl. No.: 13/865,281

(22) Filed: Apr. 18, 2013

(65) Prior Publication Data

US 2014/0313817 A1 Oct. 23, 2014

(51) Int. Cl.
*G11C 11/412* (2006.01)

(52) U.S. Cl.
CPC ................... *G11C 11/412* (2013.01)

(58) Field of Classification Search
CPC .................................................. G11C 11/412
USPC .................................. 365/154, 156
See application file for complete search history.

(56) References Cited

U.S. PATENT DOCUMENTS

| | | | | |
|---|---|---|---|---|
| 6,876,571 | B1* | 4/2005 | Khellah et al. | 365/154 |
| 7,852,661 | B2* | 12/2010 | Liu | 365/154 |
| 8,665,637 | B2* | 3/2014 | Ishikura et al. | 365/154 |
| 2010/0097844 | A1* | 4/2010 | Liu | 365/156 |
| 2011/0317476 | A1* | 12/2011 | Deng | G11C 11/412 365/156 |
| 2012/0014194 | A1* | 1/2012 | Deng | G11C 11/413 365/189.14 |

* cited by examiner

*Primary Examiner* — Richard Elms
*Assistant Examiner* — Jerome Leboeuf
(74) *Attorney, Agent, or Firm* — Artegis Law Group, LLP

(57) ABSTRACT

A static random access memory (SRAM) cell includes a storage unit configured to store a data bit in a storage node. The SRAM cell further includes an access unit coupled to the storage unit. The access unit is configured to transfer current to the storage node when a word line is asserted. The SRAM cell further includes a row header configured to provide current from a power supply when the word line is not asserted, and to not provide current from the power supply when the word line is asserted. The SRAM cell further includes a column header configured to provide current from a power supply when a write column line is not asserted, and to not provide current from the power supply when the write column line is asserted.

18 Claims, 8 Drawing Sheets

SRAM CORE CELL DESIGN WITH WRITE ASSIST

BACKGROUND OF THE INVENTION

Field of the Invention

Embodiments of the present invention relate generally to static random-access memory (SRAM) and, more specifically, to an SRAM core cell design with write assist.

Description of the Related Art

Typical static random-access memory (SRAM) storage is made up of a collection of SRAM storage cells, where each such cell is configured to store a particular value in a storage node. Each SRAM storage cell is configured to provide the value stored in the storage node in response to a read operation and to modify the value stored in the storage node in response to a write operation.

One aspect of an SRAM cell is the amount of electrical power that the SRAM cell consumes in operation. The amount of electrical power that an SRAM cell consumes is directly proportional to the power supply voltage. Therefore, reducing the power supply voltage typically reduces the amount of power consumed by an SRAM cell, which is advantageous.

However, the power supply voltage that is applied to an SRAM cell typically has to be maintained at or above a minimum value. If the power supply voltage falls below this minimum value, then the SRAM cell does not function predictably, and operations, such as read or write operations, end up producing incorrect results. For example, if the power supply voltage were to fall below the minimum value, then a write operation likely would fail to write a desired value into the SRAM cell.

As the foregoing illustrates, what is needed in the art is an SRAM cell design that allows for a reduced minimum power supply voltage.

SUMMARY OF THE INVENTION

One embodiment of the present invention sets forth a static random access memory (SRAM) cell. The SRAM cell includes a storage unit configured to store a data bit in a storage node. The SRAM cell further includes an access unit coupled to the storage unit. The access unit is configured to transfer current to the storage node when a word line is asserted. The SRAM cell further includes a row header configured to provide current from a power supply when the word line is not asserted, and to not provide current from the power supply when the word line is asserted. The SRAM cell further includes a column header configured to provide current from a power supply when a write column line is not asserted, and to not provide current from the power supply when the write column line is asserted. Other embodiments include, without limitation, a memory subsystem that includes a plurality of SRAM cells.

Other embodiments include, without limitation, a method for executing a write operation. The method includes charging a bit line associated with an SRAM cell. The method further includes asserting a word line associated with the SRAM cell. The method further includes asserting a write column line associated with the SRAM cell. The method further includes unasserting the write column line, and unasserting the word line.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

Figure 1A:
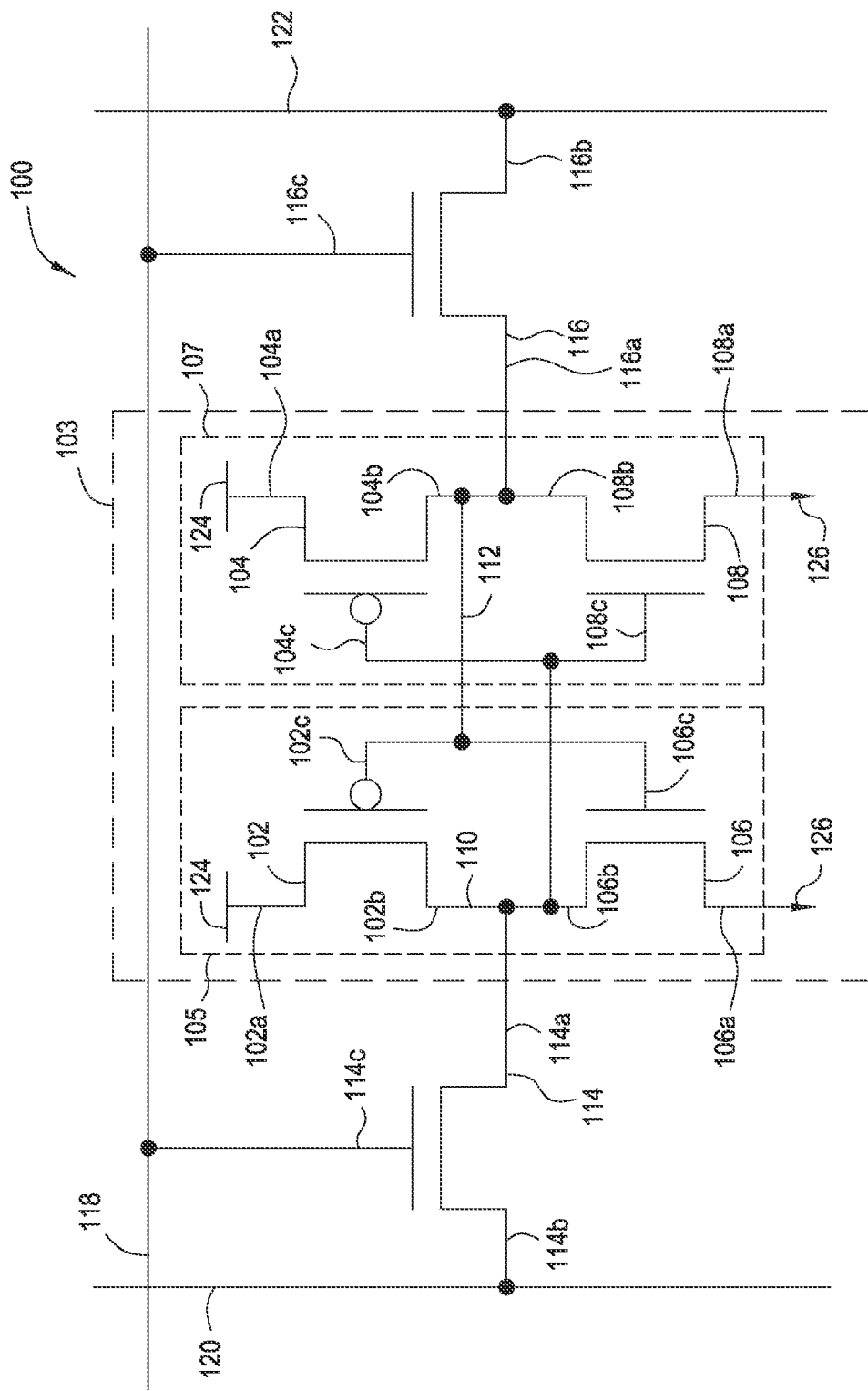
FIG. 1A illustrates a traditional six transistor ("6T") static random-access memory (SRAM) cell.

FIG. 1A illustrates a traditional six transistor ("6T") static random-access memory (SRAM) cell 100. The traditional 6T SRAM cell 100 is a bi-stable volatile memory circuit that stores one bit of data ("a data bit") in a storage unit 103. A first access transistor 114 and a second access transistor 116 allow an external control system (not shown in FIG. 1A) to read the value stored in the storage unit 103, and to write a value into the storage unit 103.

The storage unit 103 includes a first inverter 105 and a second inverter 107 arranged in a back-to-back configuration. An output of the first inverter 105 is coupled to an input of the second inverter 107 at a bit node ("BIT") 110, and an output of the second inverter 107 is coupled to an input of the first inverter at an inverted bit node ("BITB") 112. BIT 110 corresponds to the value that is stored in the storage unit 103, while BITB 112 corresponds to the inverse of the value that is stored in the storage unit 103.

The first inverter includes a first pull-up transistor 102 (which is a P-type metal-oxide-semiconductor (PMOS) transistor) and a first pull-down transistor 106 (which is an N-type metal-oxide-semiconductor (NMOS) transistor). The second inverter includes a second pull-up transistor 104 (which is a PMOS transistor) and a second pull-down transistor 108 (which is an NMOS transistor).

Within the first inverter 105, the drain 102*b* of the first pull-up transistor 102 is coupled to the drain 106*b* of the first pull-down transistor 106 at bit node 110, which lies at the output of the first inverter 105. The source 102*a* of the first pull-up transistor 102 is coupled to the power supply rail 124 (Vdd). The source 106*a* of the first pull-down transistor 106 is coupled to ground 126 (Gnd). BIT 110 is coupled to the gate 104c of the second pull-up transistor 104 and to the gate 108c of the second pull-down transistor 108, which together, form the output of the first inverter 105 and the input of the second inverter 107.

Within the second inverter 107, the drain 104b of the second pull-up transistor 104 is coupled to the drain 108b of the second pull-down transistor 108 at inverted bit node 112, which lies at the output of the second inverter 107. The source 104a of the second pull-up transistor 104 is coupled to Vdd 124, and the source 108a of the second pull-down transistor 108 is coupled to Gnd 126. BITB 112 is coupled to the gate 102c of the first pull-up transistor 102 and to the gate 106c of the first pull-down transistor 106, which together form the output of the second inverter 107 and the input of the first inverter 105.

A first access transistor 114 includes a source 114a coupled to BIT 110, a drain 114b coupled to bit line ("BL") 120, and a gate 114c coupled to word line ("WL") 118. A second access transistor 116 includes a source 116a coupled to BITB 112, a drain 116b coupled to inverted bit line ("BLB") 122, and a gate 116c coupled to WL 118.

In normal operation, when no read or write operations are conducted on the storage unit 103, the first inverter 105 and second inverter 107 maintain the value that is stored in the storage unit 103 via a feedback mechanism. More specifically, the first inverter 105 negates a value that is provided to the first inverter 105, and provides that negated value to the second inverter 107. Similarly, the second inverter 107 negates a value that is provided to the second inverter 107, and provides that negated value to the first inverter 105. The transistors of the first inverter 105 and second inverter 107 implement the feedback mechanism as now described.

When BIT 110 is high, the gate 104c of the second pull-up transistor 104 is high, and the second pull-up transistor 104 does not pass current. Further, when BIT 110 is high, the gate 108c of the second pull-down transistor 108 is high, and the second pull-down transistor 108 does pass current. Because the second pull-down transistor 108, which is coupled to Gnd 126, passes current, current passes through the second pull-down transistor 108 to Gnd 126, and BITB 112 is low.

Because BITB 112 is low when BIT 110 is high, the gate 102c of the first pull-up transistor 102 is low, and the first pull-up transistor 102 passes current. Further, the gate 106c of the first pull-down transistor 106 is low, and the first pull-down transistor 106 does not pass current. Because the first pull-up transistor 102, which is coupled to Vdd 124, passes current, BIT 110 is high when BITB 112 is low. As can be seen, when BIT 110 is high, the SRAM cell 100 causes BITB 112 to be low, and when BITB 112 is low, the SRAM cell 100 causes BIT 110 to be high.

When BIT 110 is low, the gate 104c of the second pull-up transistor is low, and the second pull-up transistor passes current. Further, when BIT 110 is low, the gate 108c of the second pull-down transistor 108 is low, and the second pull-down transistor 108 does not pass current. Because the second pull-up transistor 104, which is coupled to Vdd 124, passes current, current passes through the second pull-up transistor 104, which is coupled to Vdd 124, and BITB 112 is high.

Because BITB 112 is high when BIT 110 is low, the gate 102c of the first pull-up transistor 102 is high, and the first pull-up transistor 102 does not pass current. Further, when BITB 112 is high, the gate 106c of the first pull-down transistor 106 is high, and the first pull-down transistor 106 does pass current. Because the first pull-down transistor 106, which is coupled to Gnd 126, passes current, BIT 110 is low when BITB 112 is high.

The above discussion shows that the value at BIT 110 is the inverse of the value at BITB 112, and that the first inverter 105 and second inverter 107 create a feedback loop that stores a value in the storage unit 103.

To read or write a value into the storage unit, first access transistor 114 and second access transistor 116 interface with bit line ("BL") 120, inverted bit line ("BLB") 122 and word line ("WL") 118. The read and write operations are now described in more detail.

During a read operation, an external control unit (not shown in FIG. 1A) reads the value stored in the storage unit 103. To do this, the control unit first sets both BL 120 and BLB 122 to high. Next, the control unit sets WL 118 to high, which activates the first access transistor 114 and the second access transistor 116, allowing them to pass current. The current from BIT 110 flows through the first access transistor 114 to BL 120. Similarly, current from BITB 112 flows through the second access transistor 116, to BLB 122. A sense amplifier (not shown) reads the values in BL 120 and BLB 122 and determines the values stored in BIT 110 and BITB 112 based on the values in BL 120 and BLB 122.

A write operation "disturbs" the feedback loop to write a new value into the storage unit. During a write operation, an external control unit (not shown in FIG. 1A) writes a value into the storage unit 103. To do this, the control unit first sets BL 120 and BLB 122 to high, and then discharges either BL 120 or BLB 122 to low, depending on the value that is to be written into the SRAM cell. More specifically, if the value to be written is low, then the control unit discharges BL 120 to low and does not discharge BLB 120. If the value to be written is high, then the control unit discharges BLB 122 to low and does not discharge BL 120. Next, the control unit sets WL 118 to high. Current flows from BL 120 through the first access transistor 114 to BIT 110. Similarly, current flows from BLB 122 through the second access transistor 116 to BITB 112. At the end of the write operation, BIT 110 stores the value that BL 120 is initially set to, and BITB 112 stores the value that BLB 122 is initially set to.

Figure 1B:
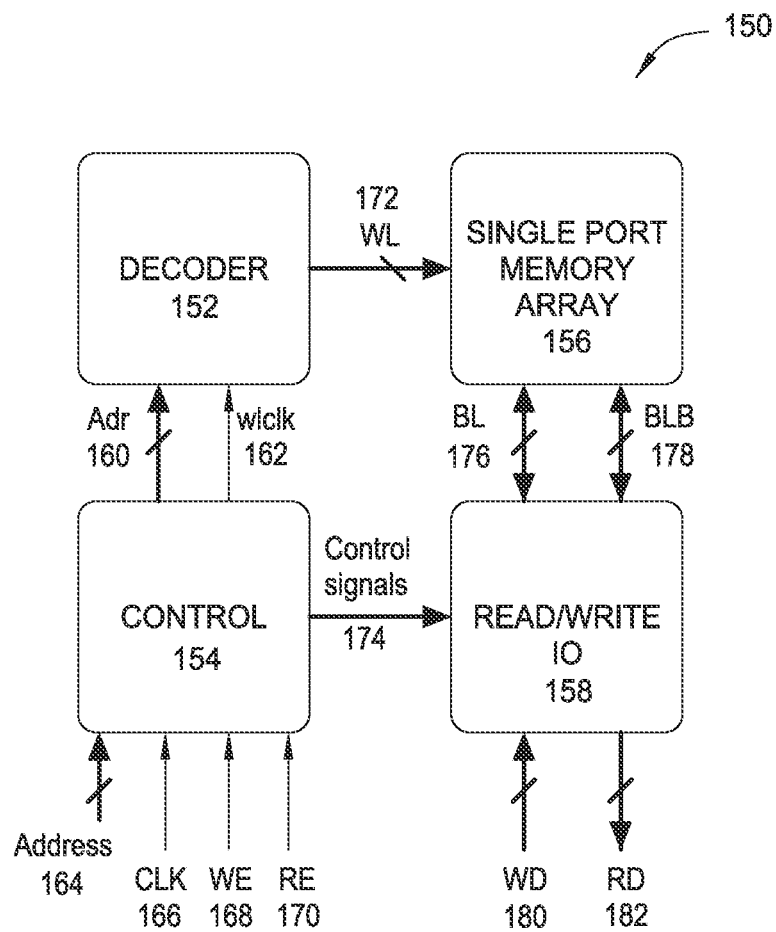
FIG. 1B illustrates a traditional memory subsystem in which a traditional 6T SRAM cell resides.

FIG. 1B illustrates a traditional memory subsystem 150 in which a traditional 6T SRAM cell resides. As shown, the memory subsystem 150 includes a decoder unit 152, a control unit 154, a single port memory array 156, and a read/write input/output (IO) unit 158.

The control unit 154, decoder unit 152, and read/write input output unit 158 are units that include electrical circuits that are configured to perform the functions specified below, in a manner that is generally known in the art. The single port memory array 156 includes a number of memory cells, such as the 6T SRAM cell 100 depicted in FIG. 1A.

To read data from or write data to the memory subsystem 150, units that are external to the memory subsystem 150, such as a memory controller (not shown) and a clock unit, provide certain signals to control unit 154 and to read/write input/output unit 158. Generally, the memory controller provides an address 164, a write enable signal 168, a read enable signal 170, and write data 180 to the memory subsystem 150. The clock unit provides a clock signal 166 to the memory subsystem 150.

The address 164 indicates one or more cells within single port memory array 156 at which data is to be accessed. The write enable signal 168 and read enable signal 170 indicate whether a read or write operation is being performed. The clock signal 166 is a timing signal that indicates when the read or write operation is performed. If a write operation is performed, the memory controller provides write data on write data line 180. If a read operation is performed, the memory subsystem 150 provides the data that is read on read data line 182.

Control unit 154 accepts the address 164, clock signal 166, write enable signal 168, and read enable signal 170. Control unit 154 provides the address to the decoder unit 152 through address line 160 and provides a word line clock signal through the word line clock signal line 162, to decoder unit 152. The word line clock signal is a timing signal that informs the decoder unit 152 of when the decoder should assert a word line in WL line 172. The WL line 172 includes word lines that are coupled to the 6T SRAM cells 100 in the single port memory array 156. The control unit also provides control signals through control signal line 174 to read/write input/output unit 158. The control signals inform the read/write input/output unit 158 of when to set BL lines and BLB lines in BL line 176 and BLB line 178.

In response to receiving an address 160 and a word line clock signal 162, the decoder unit 152 reads the address and determines which word lines to assert. The decoder unit 152 then asserts the word lines in WL line 172.

In response to receiving control signals 174, the read/write input/output unit 158 sets BL lines and BLB lines based on the control signals 174. As discussed above, for a read, the BL lines and BLB lines are all set to high for the memory cells in the single port memory array 156 that are to be read. For a write, the BL lines and BLB lines would be first set to both high and then set to values corresponding to values to be written into the memory cells.

The 6T memory cells 100 within the single port memory array 156 generally operate at or above a minimum power supply ("Vdd") voltage. If Vdd is set below this minimum Vdd voltage, then write operations may not write a requested value into a 6T SRAM memory cell 100. One reason for this is that a minimum Vdd voltage helps the first access transistor 114 and the second access transistor 116 of the 6T SRAM memory cell 100 to "overpower" the first pull-up transistor 102 and the second pull-up transistor 104 to write a data bit into the 6T SRAM memory cell 100, as now described in more detail.

Referring back to FIG. 1A, a write operation in which BIT 110 is initially high and a low value is written into BIT 110 is now described. During such a write operation, BL 120 is set to the value to be written to BIT 110 (low), and BLB 122 is set to the value to be written to BITB 112 (high). Then, WL 118 is set to high.

Because BIT 110 is high initially, BITB 112 is low initially. Because BITB 112 is low, the first pull-up transistor 102 is activated and passing current from Vdd 124. When WL 118 goes high, the first access transistor 114 is activated and begins passing current from BL 120, which is low. In order to write the low value from BL 120 into BIT 110, which stores a high value, the first access transistor 114 is configured to overpower the first pull-up transistor 102. By overpowering the first pull-up transistor 102, the first access transistor 114 passes more current than the first pull-up transistor 102, and shifts the voltage of BIT 110 down.

The low voltage at BIT 110 activates the second pull-up transistor 104, which passes current from Vdd 124. Further, because BIT 110 is now low, the gate 108c of the second pull-down transistor 108 is low, and the second pull-down transistor 108 is deactivated and stops passing current from Gnd 126. Additionally, the second pull-up transistor 104 is activated and passes current from Vdd 124. Because the second pull-up transistor 104 is passing current from Vdd 124, the voltage at BITB 112 increases. Because the voltage at BITB 112 increases, the first pull-up transistor 102 is deactivated and stops passing current from Vdd 124, and the first pull-down transistor 106 is activated, and starts passing current from Gnd 126. Because the first pull-down transistor 106 passes current from Gnd 126, BIT 110 is set to a low value, which reinforces the low value that flows through the first access transistor 114 from BL 120 to BIT 110. This completes the write operation.

As can be seen, the first access transistor 114 and the second access transistor 116 are configured to overpower the first pull-up transistor 102 and the second pull-up transistor 104. This process of overpowering involves some "current fighting" in which an access transistor passes current at a certain voltage while a pull-up transistor passes current at a different voltage. To win these fights, the access transistors are configured such that the access transistors pass more current than the pull-up transistors. Because the access transistors pass more current, the access transistors are able to "overpower" the pull-up transistors, and shift the voltage of BIT 110 or BITB 112 down.

The ability of the access transistor to overpower the pull-up transistor depends on the voltage at Vdd 124. With a sufficiently high voltage at Vdd 124, the access transistors are able to overpower the pull-up transistor. However, if Vdd 124 is too low, then the access transistors are not necessarily able to overpower the pull-up transistors, and a write operation may fail. Therefore, Vdd 124 is generally set above a minimum voltage, such that write operations generally do not fail.

However, because power consumption for an SRAM cell is proportional to Vdd 124, reducing the voltage at Vdd 124 is desirable. Unfortunately, with a traditional 6T SRAM cell such as the SRAM cell 100 depicted in FIG. 1A, the issue of current fighting means that Vdd cannot be set below a certain minimum voltage.

Figure 2:
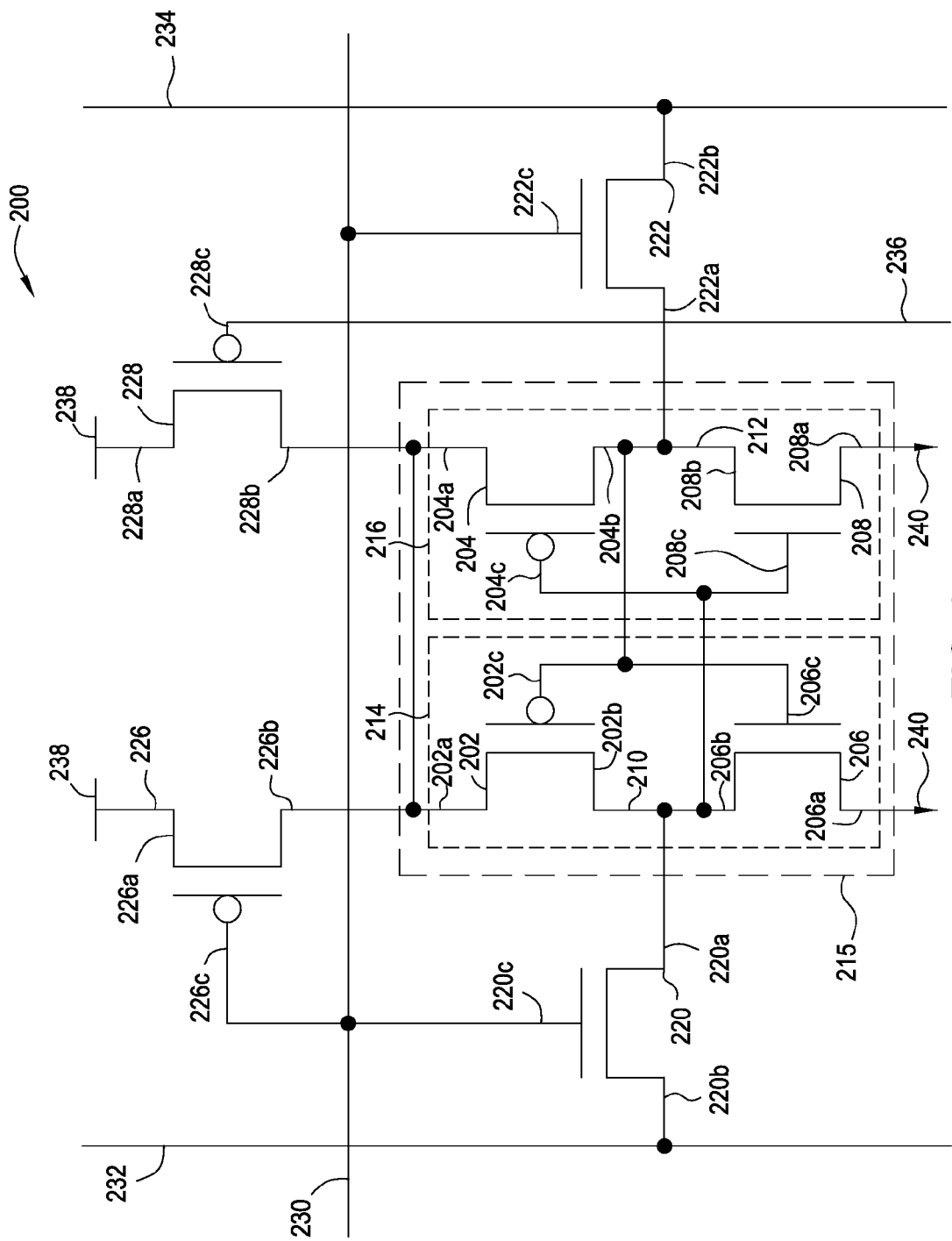
FIG. 2 illustrates a 6T SRAM memory cell, according to one embodiment of the present invention.

FIG. 2 illustrates a 6T SRAM cell 200, according to one embodiment of the present invention. As shown, the 6T SRAM memory cell 200 includes a storage unit 215, a first access transistor 220, a second access transistor 222, a row header 226, and a column header 228.

The storage unit 215 includes a first inverter 214 and a second inverter 216 arranged in a back-to-back configuration, as with the 6T SRAM cell 100 of FIG. 1A. BIT 210 lies at the output of the first inverter 214 and BITB 212 lies at the output of the second inverter 216.

An access unit includes a first access transistor 220 and a second access transistor 222. A first access transistor 220 interfaces with BL 232, WL 230, and BIT 210 to read a value from the storage unit 215 and to write a value into the storage unit 215. Similarly, a second access transistor 222 interfaces with BLB 234, WL 230, and BITB 212 to read a value from the storage unit 215 and to write a value into the storage unit 215.

The first inverter 214 includes a first pull-up transistor 202 and a first pull-down transistor 206. The source 202a of the first pull-up transistor 202 is coupled to the drain 226b of the row header 226 and to the drain 228b of the column header 228. The source 204a of the second pull-up transistor 204 is coupled to the drain 226b of the row header 226 and to the drain 228b of the column header 228. The drain 202b of the first pull-up transistor 202 is coupled to the drain 206b of the first pull-down transistor 206, to BIT 210, and to the source 220a of the first access transistor 220. The drain 204b of the second pull-up transistor 204 is coupled to the drain 208b of the second pull-down transistor 208, to BITB 212, and to the source 222a of the second access transistor 222. The source 206a of the first pull-down transistor 206 and the source 208a of the second pull-down transistor 208 are both coupled to Gnd 240.

The gate 220c of the first access transistor 220 and the gate 222c of the second access transistor 222 are both coupled to WL 230. The drain 220b of the first access transistor 220 is coupled to BL 232 and the drain 222b of the second access transistor 222 is coupled to BLB 234.

The gate 226c of the row header 226 is coupled to WL 230. The gate 228c of the column header 228 is coupled to a write column line ("WCOL") 236. The source 226a of the row header 226 and the source 228a of the column header 228 are both coupled to Vdd 238. The drain 226b of the row header 226 and the drain 228b of the column header 228 are both coupled to each other and to the source 202a of the first pull-up transistor 202 and the source 204a of the second pull-up transistor 204.

The storage unit 215, first access transistor 220, and second access transistor 222 function in a similar manner as the storage unit 103 and the first access transistor 114 and the second access transistor 116 depicted in FIG. 1A. However, the row header 226 and column header 228 help to prevent the current fighting that occurs during a write operation as discussed above with respect to FIG. 1A.

During a write operation, an external control unit (not shown in FIG. 2) asserts both WL 230 and WCOL 236. With both WL 230 and WCOL 236 asserted, both the row header 226 and the column header 228 are inactivated and thus do not pass current from Vdd 238. Therefore, neither the first pull-up transistor 202, nor the second pull-up transistor 204 pass current from Vdd 238.

With the first pull-up transistor 202 and the second pull-up transistor 204 not passing current from Vdd 238, the first access transistor 220 and the second access transistor 222 do not have to overpower the first pull-up transistor 202 or the second pull-up transistor 204. The first access transistor 220 and second access transistor 222 simply pass current from BL 232 and BLB 234 to discharge BIT 210 or BITB 212 to the appropriate voltage.

By preventing the first pull-up transistor 202 and the second pull-up transistor 204 from passing current, the row header 226 and the column header 228 help to remove or reduce current fighting experienced during a write operation. Because current fighting during a write operation places a lower bound on Vdd, reducing current fighting during a write operation allows Vdd to be lowered below this lower bound. This in turn allows a memory circuit that includes the 6T SRAM cell 200 of FIG. 2A to consume less power than the traditional 6T SRAM cell 100 of FIG. 1A.

Figure 3A:
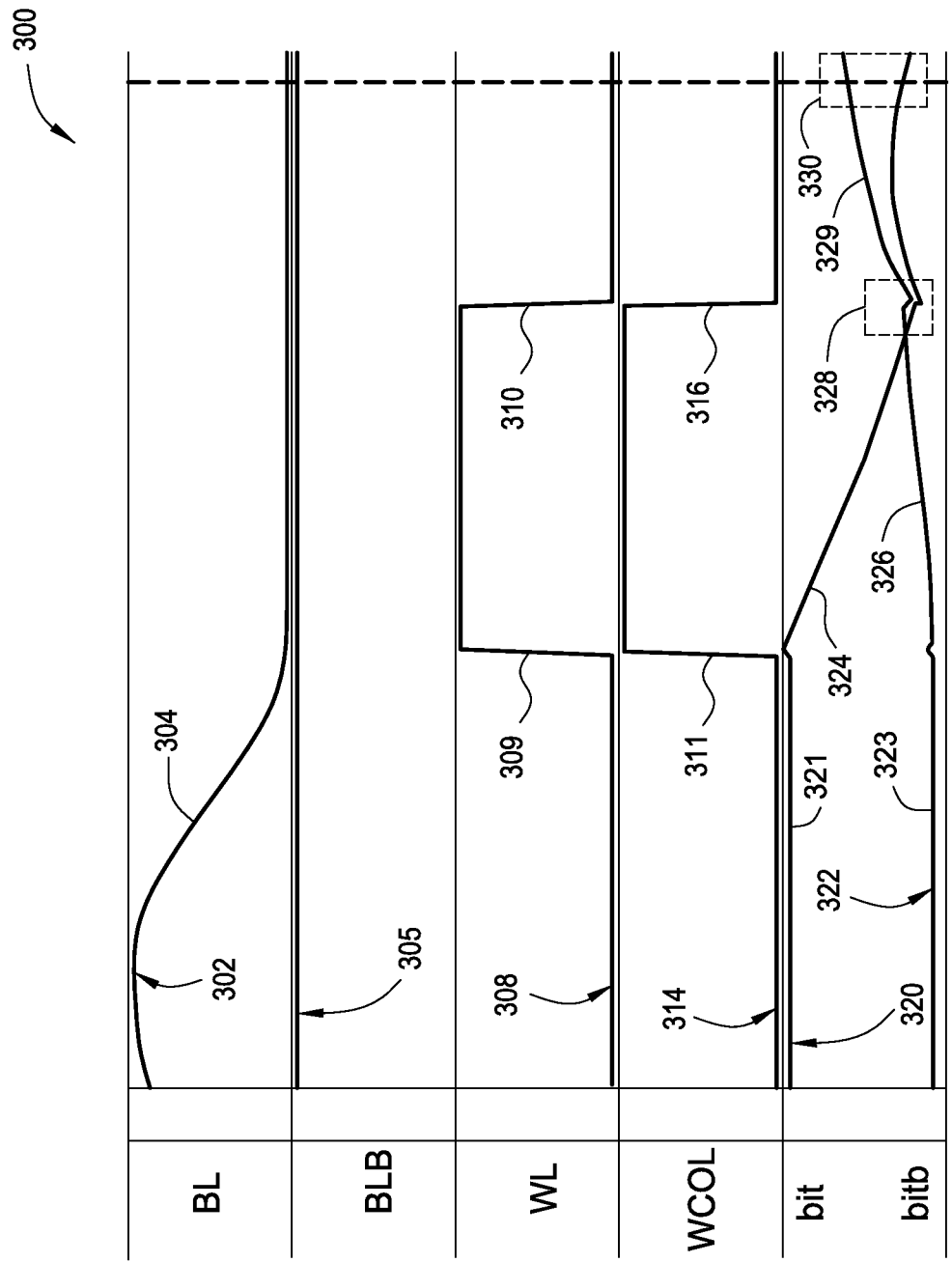
FIG. 3A illustrates a timing chart that includes graphs of various signals in 6T SRAM cell versus time, according to one embodiment of the present invention.
Figure 3B:
FIG. 3B illustrates a timing chart that includes graphs of various signals in 6T SRAM cell versus time, according to one embodiment of the present invention.
Figure 4:
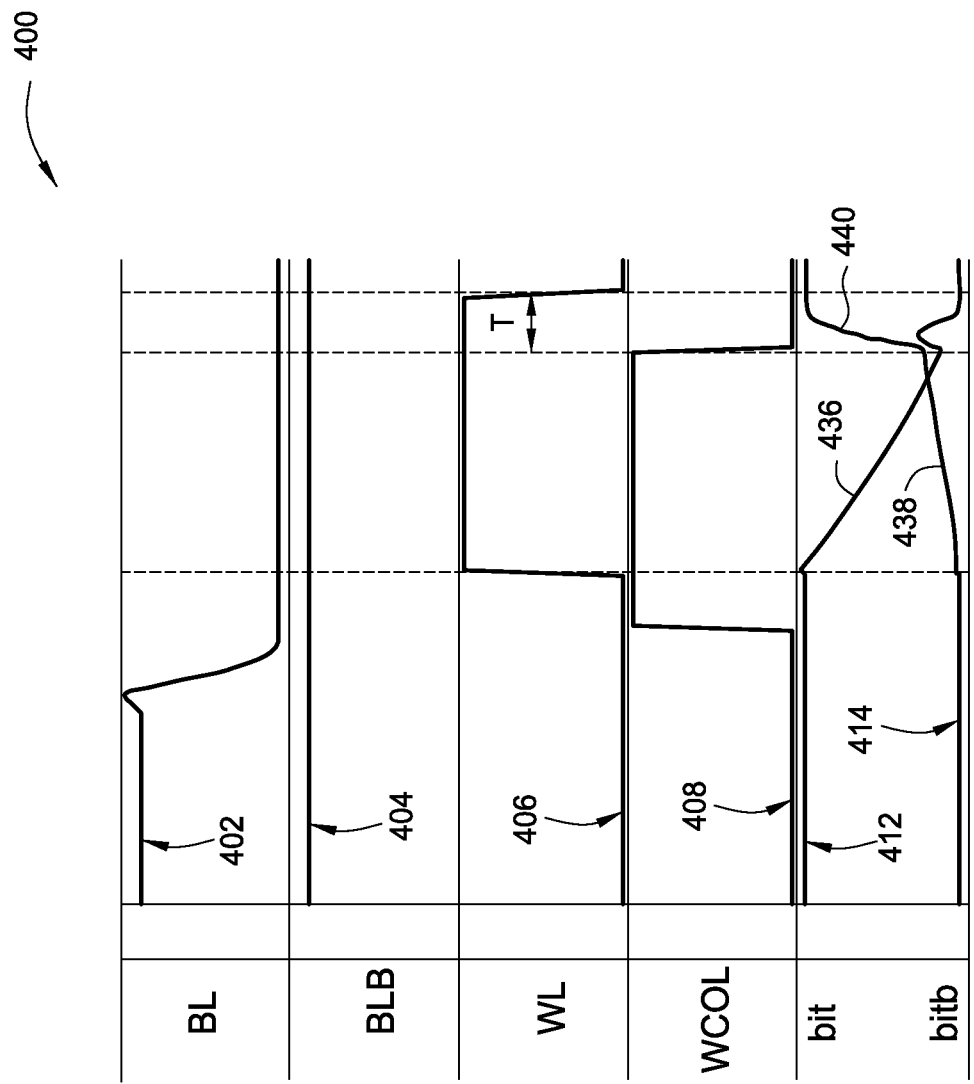
FIG. 4 illustrates a timing chart that includes graphs of various signals in 6T SRAM cell versus time, according to one embodiment of the present invention.

The timing with which WL 230 and WCOL 236 are raised to high voltage and lowered to low voltage may affect how the 6T SRAM cell 200 operates. FIGS. 3A, 3B, and 4 include timing graphs that illustrate how BIT 210 and BITB 212 are affected by timing variations in WL 230, and WCOL 236. FIGS. 3A, 3B, and 4 are discussed below with additional reference to the 6T SRAM cell 200 depicted in FIG. 2.

FIG. 3A and FIG. 3B both illustrate what occurs when WL 230 and WCOL 236 are raised and lowered at approximately the same time. As explained below in conjunction with FIGS. 3A and 3B, raising and lowering WL 230 and WCOL 236 at approximately the same may not be desirable. A staggered timing, as depicted in FIG. 4, and described in more detail below, may be more desirable. A discussion of the reasons that the timings depicted in FIGS. 3A and 3B may not be desirable is provided below, and is followed by a discussion of the staggered timing depicted in FIG. 4.

FIG. 3A illustrates a timing chart 300 that includes graphs of various signals in 6T SRAM cell 200 versus time, according to one embodiment of the present invention. As shown, the timing chart 300 includes a graph depicting BL 232 versus time ("the BL graph" 302), BLB 234 versus time ("the BLB graph" 305), WL 230 versus time ("the WL graph" 308), WCOL 236 versus time ("the WCOL graph" 314), BIT 210 versus time ("the BIT graph" 320), and BITB 212 versus time ("the BITB graph" 322).

FIG. 3A depicts a timing scheme in which both WL 230 and WCOL 236 rise and fall at the same time, and in which the "duty cycle" for WL 230 is greater than 50%. With this timing scheme, BIT 210 and BITB 212 may not reach a voltage that is near either Vdd or Gnd (their "final voltages" or "settled voltages") before the end of a write operation, which is indicted by the bold dotted vertical line in FIG. 3A. Thus, if a read operation occurs on the next cycle, the read operation may not operate correctly.

Timing chart 300 depicts a write operation on a 6T SRAM cell 200 that initially stores a high value in BIT 210. This starting value for the modified 6T SRAM cell 200 is reflected in that BIT 210 is initially at high voltage, as shown at BIT starting value 321, and BITB 212 is initially at low voltage, as shown at BITB starting value 323. The write operation writes a low value into BIT 210. A control unit thus alters BL 232 and BLB 234 to reflect the value to be stored in the modified 6T SRAM cell 200. Thus, BL 232 is brought down at BL transition point 304, and BLB 234 remains high.

Once BL 232 and BLB 234 reflect the values to be written, the control unit raises WL 230 at rising WL edge 309, and raises WCOL 236 at rising WCOL edge 311, to begin the write operation. When WL 230 rises, the first access transistor 220 is activated. At the moment that the first access transistor 220 is activated, BIT 210 still has a high voltage, and BITB 212 still has a low voltage. The first access transistor 220, which is passing a low voltage from BL 232, overwrites BIT 210 because the first pull-up transistor 202 is not passing any current. This is because with WL 230 and WCOL 236 both high, and the row header 226 and the column header 228 are both inactivated, which means that neither the row header 226 nor the column header 228 passes current from Vdd 238 to the first pull-up transistor 202. Thus, BIT 210 decreases from a high voltage to a low voltage in BIT transition 324.

Although BIT 210 transitions to a low voltage while WL 230 and WCOL 236 are high, BITB 212 does not transition to a high voltage. This is because while the first access transistor 220 and the second access transistor 222 are configured to overpower the first pull-up transistor 202 and the second pull-up transistor 204, the first access transistor 220 and the second access transistor 222 are not configured to overpower the first pull-down transistor 206 and the second pull-down transistor 208. Therefore, when the second access transistor 222 is activated with a high voltage on BLB 234, the second access transistor 222 is not able to raise BITB 212 to the high voltage value, as the second pull-down transistor 208 is activated and is still passing current from Gnd 240. However, because BIT 210 drops to a lower voltage, the voltage at the gate 208c of the second pull-down transistor 208 drops to a lower voltage, which reduces the amount of current that the second pull-down transistor 208 passes. Therefore, the second access transistor 222 is able to raise the voltage at BITB 212 to some degree. This is reflected in region 328, which shows that BITB 212 is slightly higher than BIT 210.

One reason that the 6T SRAM cell 200 cannot raise BITB 212 higher than a fairly low value is that the second pull-up transistor 204 is not passing any current. If the row header 226 and column header 228 were not present to cause the second pull-up transistor 204 to not pass current, as with the traditional 6T SRAM cell 100 depicted in FIG. 1A, the second pull-up transistor 204 would pass current from Vdd 238 which would cooperate with the second access transistor 222 to raise BITB 212. However, with the second pull-up transistor 204 not passing current, only the second access transistor 222 is passing current for changing the voltage at BITB 212. Therefore, while WL 230 and WCOL 236 are high, BITB 212 generally remains at a fairly low voltage.

Once WL 230 drops at edge 310, and WCOL 236 drops at edge 316, the second pull-up transistor 204 passes current from Vdd 238. The second pull-up transistor 204 thus starts to raise BITB 212, as shown at BITB transition point 329.

Because the duty cycle of WL 230 is greater than 50%, the period after WL 230 falls is less than half of a cycle in duration. Because of this short period of time, by the time the next cycle starts, BIT 210 and BITB 212 have not yet reached their final values (i.e., equal to the voltages at Vdd or Gnd), as can be seen in region 330. If a read operation occurs on the next cycle, the read operation may not operate correctly, because the values at BIT 210 and BITB 212 are not completely settled. Therefore, as can be seen, the timing scheme presented in FIG. 3A may not be desirable in all instances, such as when the duty cycle for WL 230 is greater than 50%.

FIG. 3B illustrates a timing chart 350 that includes graphs of various signals in 6T SRAM cell 200 versus time, according to one embodiment of the present invention. As shown, the timing chart 350 includes a graph depicting BL 232 versus time ("the BL graph" 352), BLB 234 versus time ("the BLB graph" 355), WL 230 versus time ("the WL graph" 358), WCOL 236 versus time ("the WCOL graph" 364), BIT 210 versus time ("the BIT graph" 370), and BITB 212 versus time ("the BITB graph" 372).

FIG. 3B depicts another timing scheme in which both WL 230 and WCOL 236 rise and fall at the same time, and in which "process variations" for the 6T SRAM cell 200 cause the values at BIT 210 and BITB 212 to be incorrect after a write operation. The term "process variations" refers to variations in manufacturing of the SRAM cell 200 that cause the various transistors to have different operating parameters.

As with the graph timing chart depicted in FIG. 3A, FIG. 3B depicts a timing chart 350 in which a 6T SRAM cell 200 stores a high value in BIT 210 and a low value in BITB 212, and in which a write operation is performed to store a low value in BIT 210. To perform the write operation, BL 232 is brought low and BLB 234 remains high. Then, WL 230 and WCOL 236 are both brought high.

The 6T SRAM cell 200 described with respect to FIG. 3B operates substantially similarly to the 6T SRAM cell 200 described with respect to FIG. 3A, except that process variations cause the voltages at BIT 210 and BITB 212 to be separated by only a small amount in region 378. During the write operation, BIT 210 transitions to the value shown in region 378, and BITB 212 transitions, in BITB transition 376, to the value shown in region 378. Because BIT 210 and BITB 212 are separated by only a small amount, when WL 230 drops and WCOL 236 drops, which re-activates the row header 226 and column header 228, the 6T SRAM cell 200 exhibits unpredictable behavior. More specifically, since the voltages at the gate 202c, gate 204c, gate 206c, and gate 208c are nearly the same, the final voltages at BIT 210 and BITB 212 are unpredictable.

As can be seen from the timing chart 300 in FIG. 3A and the timing chart 350 in FIG. 3B, a timing scheme that causes BIT 210 and BITB 212 to reach or be close to final values before the end of a write operation is desirable.

FIG. 4 illustrates a timing chart 400 that includes graphs of various signals in 6T SRAM cell 200 versus time, according to one embodiment of the present invention. As shown, the timing chart 400 includes a graph depicting BL 232 versus time ("the BL graph" 402), BLB 234 versus time ("the BLB graph" 405), WL 230 versus time ("the WL graph" 406), WCOL 236 versus time ("the WCOL graph" 408), BIT 210 versus time ("the BIT graph" 412), and BITB 212 versus time ("the BITB graph" 414).

FIG. 4 depicts a staggered timing scheme in which a memory controller does not raise or lower both WL 230 and WCOL 236 at the same time. Instead, the memory controller raises WCOL 236 prior to raising WL 230, and lowers WCOL 236 prior to lowering WL 230. As described below, this staggered timing scheme causes BIT 210 and BITB 212 to reach final values before the end of a write operation.

As with FIGS. 3A and 3B, FIG. 4 depicts a graph corresponding to a write operation being performed in a 6T SRAM cell 200 that stores a high value in BIT 210 and a low value in BITB 212. To perform the write operation, a memory controller lowers BL 232 and maintains BLB 234 at a high value. The memory controller raises WCOL 236 a period of time before raising WL 230. When WL 230 and WCOL 236 are both high, the row header 226 and column header 228 are inactivated, and the first pull-up transistor 202 does not pass current from Vdd 238. Because the first pull-up transistor 202 does not pass current from Vdd 238, the first access transistor 220 passes current from BL 232, that does not have to fight with current from the first pull-up transistor 202. This causes BIT 210 to shift low.

Additionally, the second access transistor 222 raises BITB 212 by a small amount. However, because the second pull-down transistor 208 is still passing some current, BITB 212 is not raised to a high value, because the second pull-down transistor 208 passes more current than, and is thus able to overpower, the second access transistor 222. This can be seen at BIT transition 436 and BITB transition 438. Note that BIT 210 does not instantaneously transition to low in BIT transition 436. Therefore, BIT 210 does not immediately reduce the voltage at the gate 208c of the second pull-down transistor 208. Consequently, during BIT transition 436, the second pull-down transistor 208 still passes some current and is still able to overpower the second access transistor 222.

To cause the values in BIT 210 and BITB 212 to settle before the end of the write operation, WCOL 236 is brought low a period of time T prior to bringing WL 230 low. T is the amount of time for a write operation to be completed while WL is high. With WCOL 236 low, the column header 228 is activated and passes current to the second pull-up transistor 204, which passes current from Vdd 238. Further, with WL 230 still high, the second access transistor 222 is still activated and is passing current from BLB 234. With both the second pull-up transistor 204 and the second access transistor 222 passing current, BITB 212 is brought higher than if the second pull-up transistor 204 were not passing current. By bringing BITB 212 higher in this manner, the gate 202c for the first pull-up transistor 202 and the gate 206c for the first pull-down transistor are both brought higher. This in turn causes the first pull-up transistor 202 to pass less current, and causes the first pull-down transistor 206 to pass more current, which lowers BIT 210. This then causes the gate 204c for the second pull-up transistor 204 and the gate 208c for the second pull-down transistor 208 to go lower. Consequently, the second pull-up transistor 204 passes more current, and the second pull-down transistor 208 passes less current, which causes BITB 212 to go higher. As can be seen, by the end of BITB transition 440, BITB 212 has reached the high voltage, and BIT 210 has reached the low voltage. Thus, when WL 230 drops, both BIT 210 and BITB 212 have reached their final values.

Figure 5:
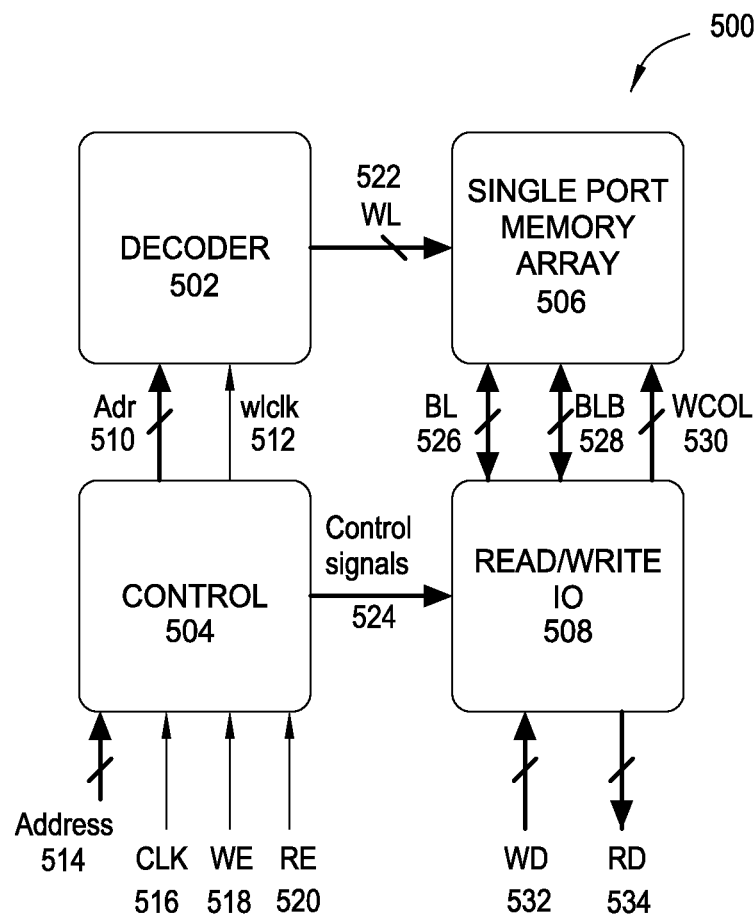
FIG. 5 illustrates a memory subsystem in which the 6T SRAM cell of FIG. 2 resides, according to one embodiment of the present invention.

FIG. 5 illustrates a memory subsystem 500 in which the 6T SRAM cell 200 of FIG. 2 resides, according to one embodiment of the present invention. As shown, the memory subsystem 500 includes a decoder unit 502, a control unit 504, a single port memory array 506, and a read/write input/output (IO) unit 508.

Memory subsystem 500 functions in a substantially similar way as memory subsystem 150 depicted in FIG. 1B, except that single port memory array 506 includes the 6T SRAM cells 200 depicted in FIG. 2, and that memory subsystem 500 is configured to control WCOL 530 and WL 522 to cause the behavior described above with respect to FIG. 4.

Control unit accepts address 514 for a memory access, clock signal 516, write enable signal 518, and read enable signal 520 as inputs. Control unit 504 provides an address 510 and word line clock 512 to decoder unit 502, and provides control signals 524 to read/write input/output unit 508, which, in response to a memory access, accepts write data 532 or provides read data 534 to an external memory controller (not shown). The control signals 524 include an indication of when to assert BL 526, BLB 528, and WCOL 530. The word line clock signal 512 indicates when decoder unit 502 asserts the word line 522 to access the single port memory array 506.

To produce the staggered timing depicted in FIG. 4, memory subsystem 500 delays raising WL 522 until a period of time after WCOL 530 is raised. This delay is implemented in control unit 504.

Figure 6:
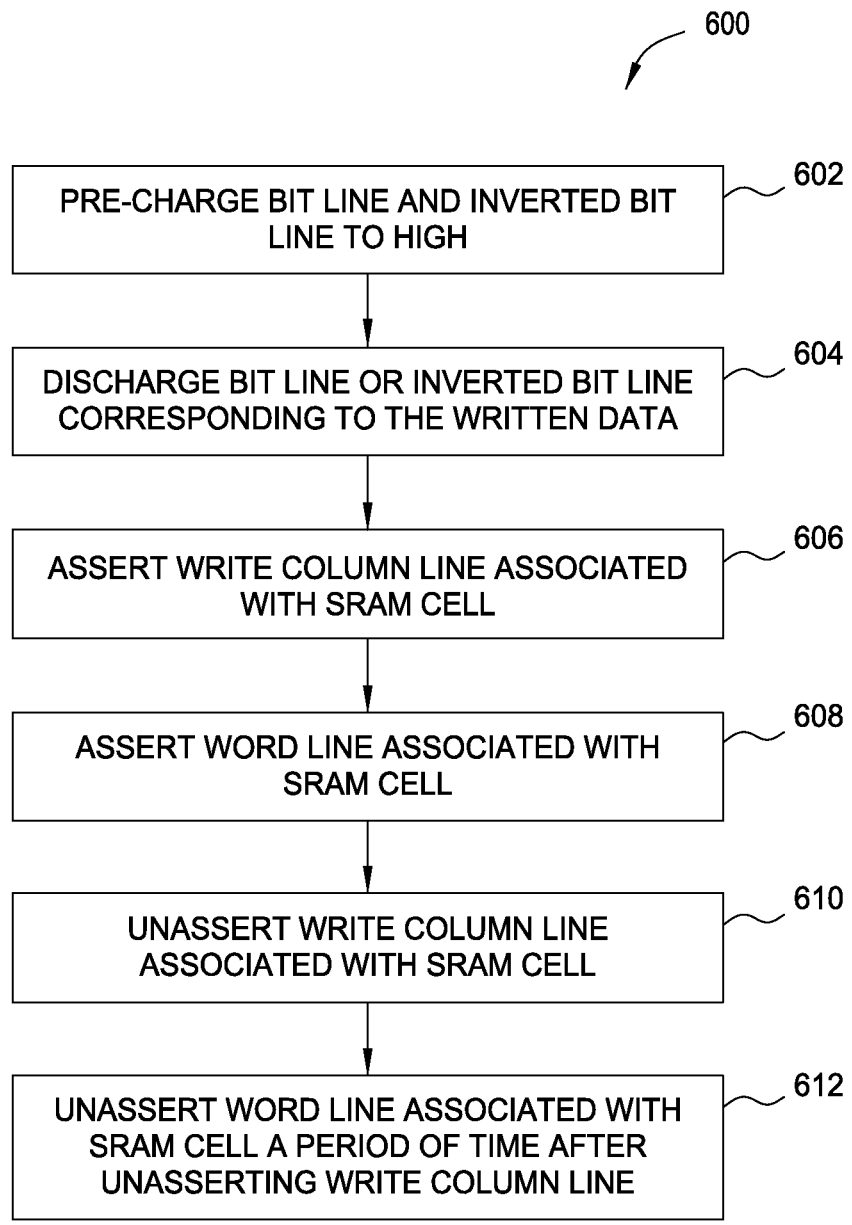
FIG. 6 is a flow diagram of method steps for writing a value to a 6T SRAM cell, according to one embodiment of the present invention.

FIG. 6 is a flow diagram of method steps for writing a value to a 6T SRAM cell, according to one embodiment of the present invention. Although the method steps are described in conjunction with FIGS. 2-5, persons skilled in the art will understand that any system configured to perform the method steps, in any order, falls within the scope of the present invention.

As shown, a method 600 begins at step 602, where the control unit 504 pre-charges both bit line 232 and inverted bit line 234 to high. Then in step 604, the control unit 504 discharges either bit line 232 or inverted bit line 234 to low depending on what data is to be written into an SRAM cell 200 in the single port memory array 506. In step 606, the control unit 504 asserts a write column line 236 associated with the SRAM cell 200. In step 608, the control unit 504 asserts a word line 230 associated with the SRAM cell 200. In step 610, the control unit 504 unasserts the write column line 236. In step 612, the control unit 504 unasserts the word line 230 a period of time after unasserting the write column line 236.

In sum, a modified 6T SRAM cell is disclosed that operates with a lower power supply voltage than a traditional 6T SRAM cell. The modified 6T SRAM cell includes a row header and a column header. Both the row header and the column header are coupled to the source of pull-up transistors in a storage unit of the SRAM cell. The row header passes current from the power supply to the pull-up transistors when WL is not asserted, but does not pass current from the power supply when WL is asserted. The column header passes current from the power supply when WCOL is not asserted, but does not pass current from the power supply when WL is asserted. When both WL and WCOL are asserted, the pull-up transistors in the storage unit do not pass current from the power supply, and access transistors may write a value into the SRAM cell without fighting with the pull-up transistors. To assist the storage unit with reaching final internal voltage values at the end of a write operation, a timing sequence is provided for the write operation. According to the timing sequence, WCOL is allowed to fall before WL is allowed to fall. By dropping WCOL, the pull-up transistors again pass current from the power supply. By passing current from the power supply, the pull-up transistors are able to cause the storage unit to reach final voltage values at the end of a write operation.

By reducing the amount of current that flows through pull-up transistors during a write operation, the modified 6T SRAM cell advantageously reduces the amount of current fighting that occurs between access transistors and the pull-up transistors. This, in turn, allows a power supply voltage to be reduced, which causes the modified 6T SRAM cell to consume less electrical power than prior art embodiments. Further, by causing WCOL to fall before WL, the modified 6T SRAM cell operates in a wide variety of process variations and access sequences.

As is generally understood by those of skill in the art, the terms "high" or "high voltage" and "low" or "low voltages" as used herein refer to voltages that are near a power supply voltage or a ground voltage, respectively. Further, a high voltage generally represents a logical "1", and a low voltage generally represents a logical "0." During operation, various nodes in a 6T SRAM cell may have intermediate voltages between the high and low voltages, but due to the bi-stable nature of the 6T SRAM cell, these intermediate voltages eventually "settle" to "final values," such as the high voltage or low voltage described above.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

What we claim is:

1. A static random access memory (SRAM) cell, comprising:
   a storage unit configured to store a data bit;
   an access unit coupled to the storage unit, to a word line, to a bit line and to an inverted bit line and configured to transfer current from the bit line to a first node of the storage unit and from the inverted bit line to a second node of the storage unit when the word line is asserted;
   a row header coupled to the storage unit, to the word line, and to a power supply rail and configured to transfer current from the power supply rail to the storage unit when the word line is not asserted and to transfer substantially no current from the power supply rail to the storage unit when the word line is asserted; and
   a column header coupled to the storage unit, to a write column line, and to the power supply rail and configured to transfer current from the power supply rail to the storage unit when the write column line is not asserted and to transfer substantially no current from the power supply rail to the storage unit when the write column line is asserted;

wherein the SRAM cell receives an assertion of the write column line prior to receiving an assertion of the word line and the SRAM cell receives a removal of the assertion of the write column line prior to receiving a removal of the assertion of the word line, and the duration of assertion of the write column line is equal to the duration of assertion of the word line.

2. The SRAM cell of claim 1, wherein the row header further comprises a switching mechanism configured to transfer current from the power supply rail to the storage unit when the word line is not asserted and to not transfer current from the power supply rail to the storage unit when the word line is asserted.

3. The SRAM cell of claim 2, wherein the column header further comprises a switching mechanism configured to transfer current from the power supply rail to the storage unit when the write column line is not asserted and to not transfer current from the power supply rail to the storage unit when the write column line is asserted.

4. The SRAM cell of claim 3, wherein the storage unit further comprises:
a first inverter having an input and an output; and
a second inverter having an input and an output,
wherein the input of the second inverter is coupled to the output of the first inverter, and the input of the first inverter is coupled to the output of the second inverter.

5. The SRAM cell of claim 4, wherein:
the row header includes a row header transistor having a source, a gate, and a drain;
the gate of the row header transistor is coupled to the word line;
the source of the row header transistor is coupled to a voltage source; and
the drain of the row header transistor is coupled to the storage unit.

6. The SRAM cell of claim 5, wherein:
the column header includes a column header transistor having a source, a gate, and a drain;
the gate of the column header transistor is coupled to the write column line;
the source of the column header transistor is coupled to the voltage source; and
the drain of the column header transistor is coupled to the storage unit.

7. The SRAM cell of claim 6, wherein:
the first inverter has a first pull-up transistor having a source, a gate, and a drain, and a first pull-down transistor having a source, a gate, and a drain;
the second inverter has a second pull-up transistor having a source, a gate, and a drain, and a second pull-down transistor having a source, a gate, and a drain;
the gate of the first pull-up transistor is coupled to the gate of the first pull-down transistor;
the gate of the second pull-up transistor is coupled to the gate of the second pull-down transistor;
the source of the first pull-up transistor is coupled to the drain of the row header transistor and to the drain of the column header transistor; and
the source of the second pull-up transistor is coupled to the drain of the row header transistor and to the drain of the column header transistor.

8. The SRAM cell of claim 7, wherein the access unit includes:

a first access transistor having a current path and a gate; and
a second access transistor having a current path and a gate,
wherein the current path of the first access transistor is coupled to a bit line, to the drain of the first pull-up transistor, and to the drain of the first pull-down transistor, and the gate of the first access transistor is coupled to the word line, and
wherein the current path of the second access transistor is coupled to an inverted bit line, to the drain of the second pull-up transistor, and to the drain of the second pull-down transistor, and the gate of the second access transistor is coupled to the word line.

9. The SRAM cell of claim 1, wherein at least one of a first node associated with the bit line and a second node associated with the inverted bit line have not reached final values when assertion of the write column line is removed, and wherein both the bit line and the inverted bit line have reached final values when assertion of the word line is removed.

10. The SRAM cell of claim 1, wherein a duration of time between the removal of the assertion of the write column line prior and the removal of the assertion of the word line comprises an amount of time for a write operation to complete while the word line is asserted.

11. A memory subsystem, comprising:
a plurality of static random access memory (SRAM) cells, each SRAM cell comprising:
a storage unit configured to store a data bit in a storage node,
an access unit coupled to the storage unit, to a word line, to a bit line and to an inverted bit line and configured to transfer current from the bit line to a first node of the storage unit and from the inverted bit line to a second node of the storage unit when the word line is asserted,
a row header coupled to the storage unit, to the word line, and to a power supply rail and configured to transfer current from the power supply rail to the storage unit when the word line is not asserted and to transfer substantially no current from the power supply rail to the storage unit when the word line is asserted, and
a column header coupled to the storage unit, to a write column line, and to the power supply rail and configured to transfer current from the power supply rail to the storage unit when the write column line is not asserted and to transfer substantially no current from the power supply rail to the storage unit when the write column line is asserted;
wherein the SRAM cell receives an assertion of the write column line prior to receiving an assertion of the word line and the SRAM cell receives a removal of the assertion of the write column line prior to receiving a removal of the assertion of the word line, and the duration of assertion of the write column line is equal to the duration of assertion of the word line; and
a control unit configured to execute a write operation by:
precharging a bit line and inverted bit line to a high value;
depending on a value to be written into an SRAM cell, discharging a bit line or inverted bit line associated with the SRAM cell included in the plurality of SRAM cells;

asserting a write column line associated with the SRAM cell;

asserting a word line associated with the SRAM cell upon expiration of a first period of time after asserting the write column line;

unasserting the write column line;

delaying for a second duration after unasserting the write column line; and unasserting the word line upon expiration of a second period of time after unasserting the write column line.

12. The memory subsystem of claim 11, further comprising a decoder configured to receive an address, to determine a word line from a plurality of word lines to assert, based on the address, and to assert the word line.

13. The memory subsystem of claim 12, wherein the control unit is further configured to receive an address, a read enable signal, a write enable signal, and a clock signal, to assert a word line clock signal based on the write enable signal, the read enable signal, and the clock signal, and to send the address to the decoder.

14. The memory subsystem of claim 13, further comprising a read/write input/output unit configured to accept write data as input, and to accept control signals from the control unit, and further configured to set a bit line, an inverted bit line, and a write column line in response to the control signals and the write data.

15. The memory subsystem of claim 14, wherein the storage unit further comprises:

a first inverter having an input and an output; and a second inverter having an input and an output, wherein the input of the second inverter is coupled to the output of the first inverter, and the input of the first inverter is coupled to the output of the second inverter.

16. The memory subsystem of claim 15, wherein:

the row header includes a row header transistor having a source, a gate, and a drain;

the gate of the row header transistor is coupled to the word line;

the source of the row header transistor is coupled to a voltage source; and the drain of the row header transistor is coupled to the storage unit.

17. The memory subsystem of claim 16, wherein:

the column header includes a column header transistor having a source, a gate, and a drain;

the gate of the column header transistor is coupled to the write column line;

the source of the column header transistor is coupled to the voltage source; and the drain of the column header transistor is coupled to the storage unit.

18. The memory subsystem of claim 17, wherein:

the first inverter has a first pull-up transistor having a source, a gate, and a drain, and a first pull-down transistor having a source, a gate, and a drain;

the second inverter has a second pull-up transistor having a source, a gate, and a drain, and a second pull-down transistor having a source, a gate, and a drain;

the gate of the first pull-up transistor is coupled to the gate of the first pull-down transistor;

the gate of the second pull-up transistor is coupled to the gate of the second pull-down transistor;

the source of the first pull-up transistor is coupled to the drain of the row header transistor and to the drain of the column header transistor; and the source of the second pull-up transistor is coupled to the drain of the row header transistor and to the drain of the column header transistor.

* * * * *